US011887655B2

(12) United States Patent
Lu et al.

(10) Patent No.: US 11,887,655 B2
(45) Date of Patent: *Jan. 30, 2024

(54) SENSE AMPLIFIER, MEMORY, AND METHOD FOR CONTROLLING SENSE AMPLIFIER BY CONFIGURING STRUCTURES USING SWITCHES

(71) Applicants: ANHUI UNIVERSITY, Anhui (CN); CHANGXIN MEMORY TECHNOLOGIES, INC., Hefei (CN)

(72) Inventors: Wenjuan Lu, Hefei (CN); Junlin Ge, Hefei (CN); Jun He, Hefei (CN); Zhan Ying, Hefei (CN); Xin Li, Hefei (CN); Kanyu Cao, Hefei (CN); Chunyu Peng, Hefei (CN); Zhiting Lin, Hefei (CN); Xiulong Wu, Hefei (CN); Junning Chen, Hefei (CN)

(73) Assignees: ANHUI UNIVERSITY, Anhui (CN); CHANGXIN MEMORY TECHNOLOGIES, INC., Hefei (CN)

( * ) Notice: Subject to any disclaimer, the term of this patent is extended or adjusted under 35 U.S.C. 154(b) by 252 days.

This patent is subject to a terminal disclaimer.

(21) Appl. No.: 17/474,172

(22) Filed: Sep. 14, 2021

(65) Prior Publication Data
US 2022/0051713 A1 Feb. 17, 2022

Related U.S. Application Data

(63) Continuation of application No. PCT/CN2020/139627, filed on Dec. 25, 2020.

(30) Foreign Application Priority Data

Aug. 13, 2020 (CN) .......................... 202010811719.9

(51) Int. Cl.
*G11C 11/4091* (2006.01)
*G11C 11/4096* (2006.01)
*G11C 11/4094* (2006.01)

(52) U.S. Cl.
CPC ...... *G11C 11/4091* (2013.01); *G11C 11/4094* (2013.01); *G11C 11/4096* (2013.01)

(58) Field of Classification Search
CPC ............ G11C 11/4091; G11C 11/4094; G11C 11/4096; G11C 7/065; G11C 7/12
See application file for complete search history.

(56) References Cited

U.S. PATENT DOCUMENTS 5,537,066 A 7/1996 Kawashima
5,764,103 A 6/1998 Burra
(Continued)

FOREIGN PATENT DOCUMENTS

CN 101540188 A 9/2009
CN 102148051 A 8/2011
(Continued)

OTHER PUBLICATIONS

International Search Report in the international application No. PCT/CN2020/139627, dated May 17, 2021. 2 pages.
(Continued)

*Primary Examiner* — Sultana Begum
(74) *Attorney, Agent, or Firm* — Cooper Legal Group, LLC

(57) ABSTRACT

A sense amplifier includes an amplification module and a control module electrically connected to the amplification module. Herein, in a case of reading a data in a memory cell on a first bit line, at an offset compensation stage of the sense amplifier, the control module is arranged to configure the amplification module to include a first diode structure, a first current mirror structure, and a first inverter with an input
(Continued)

terminal and an output terminal connected to each other. In a case of reading a data in a memory cell on a second bit line, at the offset compensation stage of the sense amplifier, the control module is arranged to configure the amplification module to include a second diode structure, a second current mirror structure, and a second inverter with an input terminal and an output terminal connected to each other.

20 Claims, 14 Drawing Sheets

(56) References Cited

U.S. PATENT DOCUMENTS

| | | | |
|---|---|---|---|
| 5,990,737 | A | 11/1999 | Czarnul |
| 6,225,834 | B1 | 5/2001 | Gang |
| 6,529,421 | B1 | 3/2003 | Marr |
| 7,167,049 | B2 | 1/2007 | Lim |
| 8,072,200 | B1 | 12/2011 | Qiu |
| 8,416,602 | B2 * | 4/2013 | Kitagawa ........... G11C 13/0007 365/158 |
| 9,418,714 | B2 | 8/2016 | Sinangil |
| 9,553,550 | B2 | 1/2017 | Puliafico |
| 9,698,765 | B1 | 7/2017 | La Rosa |
| 10,741,232 | B1 | 8/2020 | Jabeur |
| 10,783,969 | B2 | 9/2020 | Sheng |
| 11,315,610 | B1 | 4/2022 | Peng |
| 11,423,956 | B2 | 8/2022 | Shang |
| 2004/0027892 | A1 | 2/2004 | Sim |
| 2004/0218446 | A1 | 11/2004 | Gogl |
| 2006/0044903 | A1 | 3/2006 | Forbes |
| 2007/0024325 | A1 | 2/2007 | Chen |
| 2008/0165602 | A1 | 7/2008 | Sutardja |
| 2009/0058512 | A1 | 3/2009 | Huang |
| 2009/0238582 | A1 | 9/2009 | Tsunoda |
| 2010/0157672 | A1 | 6/2010 | Barkley |
| 2010/0157698 | A1 | 6/2010 | Barth, Jr. |
| 2010/0182860 | A1 | 7/2010 | Chang |
| 2011/0110174 | A1 | 5/2011 | Cho |
| 2011/0148389 | A1 | 6/2011 | Bohannon |
| 2012/0235708 | A1 | 9/2012 | Slamowitz |
| 2013/0201761 | A1 | 8/2013 | Kim |
| 2013/0314977 | A1 | 11/2013 | Wang |
| 2013/0322154 | A1 | 12/2013 | Youn |
| 2015/0008841 | A1 | 1/2015 | Wu et al. |
| 2015/0016183 | A1 | 1/2015 | Sinangil |
| 2015/0187394 | A1 | 7/2015 | Lee |
| 2015/0194209 | A1 | 7/2015 | Wu et al. |
| 2015/0243350 | A1 | 8/2015 | Chen |
| 2016/0203856 | A1 | 7/2016 | Sachdev |
| 2018/0336952 | A1 | 11/2018 | Miyazaki |
| 2019/0007000 | A1 | 1/2019 | Jeong |
| 2019/0279717 | A1 | 9/2019 | Sheng |
| 2019/0325946 | A1 | 10/2019 | Lu |
| 2019/0384337 | A1 | 12/2019 | Lu |
| 2020/0105315 | A1 | 4/2020 | Chang |
| 2020/0126615 | A1 | 4/2020 | Lei |
| 2020/0314374 | A1 | 10/2020 | Yang |
| 2022/0270653 | A1 | 8/2022 | Cao |
| 2022/0320076 | A1 | 10/2022 | Li |

FOREIGN PATENT DOCUMENTS

| | | |
|---|---|---|
| CN | 102290086 A | 12/2011 |
| CN | 102385900 A | 3/2012 |
| CN | 102385901 A | 3/2012 |
| CN | 102394094 A | 3/2012 |
| CN | 102420005 A | 4/2012 |
| CN | 102592650 A | 7/2012 |
| CN | 102612715 A | 7/2012 |
| CN | 202549301 U | 11/2012 |
| CN | 102831921 A | 12/2012 |
| CN | 103745743 A | 4/2014 |
| CN | 105895139 A | 8/2016 |
| CN | 106328182 A | 1/2017 |
| CN | 106486143 A | 3/2017 |
| CN | 106782652 A | 5/2017 |
| CN | 107464581 A | 12/2017 |
| CN | 108231100 A | 6/2018 |
| CN | 108492840 A | 9/2018 |
| CN | 109448768 A | 3/2019 |
| CN | 109686387 A | 4/2019 |
| CN | 109994140 A | 7/2019 |
| CN | 210575115 U | 5/2020 |
| CN | 210606637 U | 5/2020 |
| CN | 111313848 A | 6/2020 |
| CN | 111383674 A | 7/2020 |
| CN | 111863054 A | 10/2020 |
| CN | 111863055 A | 10/2020 |
| CN | 111933194 A | 11/2020 |
| CN | 111933195 A | 11/2020 |
| EP | 2442311 A1 | 4/2012 |
| KR | 20000039961 A | 7/2000 |
| WO | 2021101709 A1 | 5/2021 |

OTHER PUBLICATIONS

English translation of the Written Opinion of the International Search Authority in the international application No. PCT/CN2020/139627, dated May 17, 2021. 4 pages.

"Sensing Voltage Compensation Circuit for Low-power DRAM Bit-line Sense Amplifier", 2018; Suk Min Kim, Tae Woo Oh and Seong-Ook Jung; International Conference on Electronics, Information, and Communication (ICEIC), Apr. 5, 2018. the whole document. 4 pages.

"A ZQ Calibration Method in DDR3 DRAM", 2018; Wang Xiao-Guang, Wang Song, Tan Jie and Li Ji; China Integrated Circuit, Issue 07, China Academic Journal Electronic Publishing House; 4 pages with English abstract.

First Office Action of the Chinese application No. 202010811719.9, dated Mar. 22, 2022. 7 pages with English abstract.

International Search Report in the international application No. PCT/CN2020/139652, dated May 31, 2021. 2 pages.

English translation of the Written Opinion of the International Search Authority in the international application No. PCT/CN2020/139652, dated May 31, 2021. 4 pages.

"Novel Current-mirror Based Time Dependent Sense Scheme for MLC PRAM"; 2019; Jun-Tae Choi, Jun-Young Kweon, Yunheub Song and Tony Tae-Hyoung Kim; 2019 International Conference on Electronics, Information, and Communication (ICEIC), 3 pages.

"Design of a Low-voltage High-speed Sense Amplifier Circuit", Jun. 2016; Yang Guangjun; Research & Progress of SEE, 5 pages with English abstract.

"Design of a High Speed Sense Amplifier Circuit", Jun. 2015; Zhang Hua; Microelectronics, vol. 45, No. 3, 5 pages with English abstract.

First Office Action of the Chinese application No. 202010902453.9, dated May 19, 2022. 8 pages with English abstract.

Notice of Allowance of the Chinese application No. 202010902453.9, dated Aug. 4, 2022. 6 pages with English translation.

First Office Action of the U.S. Appl. No. 17/474,166, dated Jul. 28, 2023. 22 pages.

International Search Report in the international application No. PCT/CN2020/139653, dated May 26, 2021. 2 pages.

English translation of the Written Opinion of the International Search Authority in the international application No. PCT/CN2020/139653, dated May 26, 2021. 4 pages.

"Charge Sensitive Amplifier With Offset-Compensated V-to-I Converter for the Mini-SDD-Based DSSC Detector", 2019; A. Grande, C.Fiorini, F. Erdinger, P. Fischer and M. Porro; IEEE Transactions on Nuclear Science, vol. 66, No. 10, 7 pages.

"Experimental Validation of Charge-Sensitive Amplifier Configuration that Compensates for Detector Capacitance", Apr. 2016; Inyong Kwon, Taehoon Kang and Mark D. Hammig; IEEE Transactions on Nuclear Science, vol. 63, pp. 1202-1208. 7 pages.

"Design of Current-mirror Compensation Circuit for Multi-row Read in In-SRAM Computing", Date not available; Fang Yaqi;

(56) References Cited

OTHER PUBLICATIONS

China Excellent Master's Degree Thesis Full Text Database & Information Science and Technology Series, vol. 2020, No. 7, 64 pages with English abstract.
"A 4T Dual Replica-Bitline Delay Technique Forprocess-Variation-Tolerant Low Voltage SRAM Sense Amplifier Timing", Mar. 2015; Ye Ya-Dong, Wu Xiu-Long and Lin Zhi-Ting; Microelectronics & Computer, vol. 32, N. 3, 4 pages with English abstract.
First Office Action of the Chinese application No. 202010902476.X, dated May 19, 2022. 13 pages with English translation.
Notice of Allowance of the Chinese application No. 202010902476. X, dated Aug. 4, 2022. 6 pages with English translation.
"Offset-Compensation High-Performance Sense Amplifier for Low-Voltage DRAM Based on Current Mirror and Switching Point", 2022, Pei Huang, Kua-Chang Chang, Junlin Ge, Chunyu Peng, Xiulong Wu, Junning Chen and Zhiting Lin; IEEE Transactions on Circuits and Systems, vol. 69, No. 4, pp. 2011-2015.
First Office Action of the U.S. Appl. No. 17/472,157, dated Jul. 5, 2023. 24 pages.
International Search Report in the international application No. PCT/CN2020/139373 , dated May 12, 2021. 2 pages.
English translation of the Written Opinion of the International Search Authority in the international application No. PCT/CN2020/139373 , dated May 12, 2021. 4 pages.
"Design of High-speed High-reliability Voltage Mode Sense Amplifier", 2010; Wang Yi Ran, Yu Zong Guang and Jia Ze; Computer Technology and Its Applications vol. 2010, No. 5, 5 pages with English abstract.
"Offset-canceling Current-sampling Sense Amplifier for Resistive Nonvolatile Memory in 65 nm CMOS", 2016; Tuehui Na, Byungkyu Song, Jung Pill Kim, Seung H. Kang and Seong-Ook Jung; IEEE Journal of Solid-State Circuits, vol. 52, Issue 2, 9 pages.
The Analysis and Design Based on 65nm SRAM for Low-Offset-Voltage and Self-Activated Sense Amplifier, China Excellent Master's Dissertation Full Text Database & Information Science and Technology Series, vol. 8, 2017, Aug. 15, 2017. p. 8-54. 69 pages with English abstract.
First Office Action of the Chinese application No. 202010811687.2, dated May 19, 2022. 12 pages with English translation.
Notice of Allowance of the Chinese application No. 202010811687. 2, dated Aug. 4, 2022. 6 pages with English translation.
First Office Action of the U.S. Appl. No. 17/441,679, dated Feb. 17, 2022. 16 pages.
Final Office Action of the U.S. Appl. No. 17/472,157, dated Oct. 13, 2023. 45 pages.

\* cited by examiner

SENSE AMPLIFIER, MEMORY, AND METHOD FOR CONTROLLING SENSE AMPLIFIER BY CONFIGURING STRUCTURES USING SWITCHES

CROSS-REFERENCE TO RELATED APPLICATIONS

This is a continuation application of International Patent Application No. PCT/CN2020/139627, filed on Dec. 25, 2020, which claims priority to Chinese Patent Application No. 202010811719.9, filed on Aug. 13, 2020 and entitled "SENSE AMPLIFIER, MEMORY, AND METHOD FOR CONTROLLING SENSE AMPLIFIER. The disclosures of International Patent Application No. PCT/CN2020/139627 and Chinese Patent Application No. 202010811719.9 are incorporated by reference herein in their entireties.

TECHNICAL FIELD

The disclosure relates to the technical field of a semiconductor memory, in particular to a sense amplifier, a memory, and a method for controlling a sense amplifier.

BACKGROUND

With the popularization of electronic devices such as mobile phones, tablet computers, personal computers, etc., technology of a semiconductor memory also has been developed rapidly. For example, a Dynamic Random Access Memory (DRAM) has been widely used in various electronic devices due to its advantages of high density, low power consumption, low price, etc.

In the DRAM, a sense amplifier is configured to read a data in a memory cell and has a bit line BL (read bit line) input terminal and a bit line BLB (reference bit line) input terminal. In the read operation (or the refresh operation), the functions of the sense amplifier are to read a voltage difference between the bit line BL and the reference bit line BLB, and to amplify the voltage difference between these two bit lines.

The sense amplifier includes Metal-Oxide Semiconductor Field Effect Transistors (MOSFETs). However, in the semiconductor technology, the same two MOSFETs may be mismatched theoretically due to the variation of process and temperature, that is, they have different characteristics, causing the sense amplifier to generate offset noise which may severely affect the performance of the semiconductor memory.

It should be noted that the above information disclosed in the Background section is only for enhancement of understanding of the background of the disclosure, and therefore it may contain information that does not constitute the related art that is already known to a person of ordinary skill in the art.

SUMMARY

An object of the disclosure is to provide a sense amplifier, a memory, and a method for controlling a sense amplifier, thereby overcoming, at least to some extent, the problem that the performance of a semiconductor memory is affected by the mismatch of transistors in the sense amplifier.

According to a first aspect of the disclosure, there is provided a sense amplifier, which includes: an amplification module arranged to read a data in a memory cell on a first bit line or a second bit line; and a control module, electrically connected to the amplification module. Herein, in a case of reading the data in the memory cell on the first bit line, at an offset compensation stage of the sense amplifier, the control module is arranged to configure the amplification module to include a first diode structure, a first current mirror structure, and a first inverter with an input terminal and an output terminal connected to each other. And in a case of reading the data in the memory cell on the second bit line, at the offset compensation stage of the sense amplifier, the control module is arranged to configure the amplification module to include a second diode structure, a second current mirror structure, and a second inverter with an input terminal and an output terminal connected to each other.

In an embodiment, the amplification module includes: a first P-channel Metal Oxide Semiconductor (PMOS) transistor; a second PMOS transistor; a first N-channel Metal Oxide Semiconductor (NMOS) transistor, a gate of the first NMOS transistor being connected to the first bit line, and a drain of the first NMOS transistor being connected to a drain of the first PMOS transistor through a first node; and a second NMOS transistor, a gate of the second NMOS transistor being connected to the second bit line, and a drain of the second NMOS transistor being connected to a drain of the second PMOS transistor through a second node. Herein, in the case of reading the data in the memory cell on the first bit line, at the offset compensation stage of the sense amplifier, the second NMOS transistor is configured as the first diode structure, the first PMOS transistor and the second PMOS transistor are configured as the first current mirror structure, and the first PMOS transistor and the first NMOS transistor are configured as the first inverter with the input terminal and the output terminal connected to each other. And in the case of reading the data in the memory cell on the second bit line, at the offset compensation stage of the sense amplifier, the first NMOS transistor is configured as the second diode structure, the first PMOS transistor and the second PMOS transistor are configured as the second current mirror structure, and the second PMOS transistor and the second NMOS transistor are configured as the second inverter with the input terminal and the output terminal connected to each other.

In an embodiment, the control module includes: a first switch, a first terminal of the first switch being connected to a gate of the first PMOS transistor, and a second terminal of the first switch being connected to a gate of the second PMOS transistor; a second switch, a first terminal of the second switch being connected to the gate of the second PMOS transistor, and a second terminal of the second switch being connected to the first node; a third switch, a first terminal of the third switch being connected to the second node, and a second terminal of the third switch being connected to the gate of the first PMOS transistor; a fourth switch, a first terminal of the fourth switch being connected to the first node, and a second terminal of the fourth switch being connected to the first bit line; and a fifth switch, a first terminal of the fifth switch being connected to the second bit line, and a second terminal of the fifth switch being connected to the second node. Herein, in the case of reading the data in the memory cell on the first bit line, at the offset compensation stage of the sense amplifier, the first switch, the second switch, the fourth switch and the fifth switch are turned on, and the third switch is turned off. In the case of reading the data in the memory cell on the second bit line, at the offset compensation stage of the sense amplifier, the first switch, the third switch, the fourth switch and the fifth switch are turned on, and the second switch is turned off.

In an embodiment, at the offset compensation stage of the sense amplifier, a source of the first PMOS transistor and a source of the second PMOS transistor receive a first voltage, and a source of the first NMOS transistor and a source of the second NMOS transistor are grounded.

In an embodiment, in the case of reading the data in the memory cell on the first bit line, at a first amplification stage of the sense amplifier, the control module is arranged to configure the amplification module as a third inverter.

In an embodiment, in the case of reading the data in the memory cell on the first bit line, at the first amplification stage of the sense amplifier, the second PMOS transistor and the second NMOS transistor are controlled to be in a cutoff region, and the first PMOS transistor and the first NMOS transistor are configured as the third inverter.

In an embodiment, in the case of reading the data in the memory cell on the second bit line, at a first amplification stage of the sense amplifier, the control module is arranged to configure the amplification module as a fourth inverter.

In an embodiment, in the case of reading the data in the memory cell on the second bit line, at the first amplification stage of the sense amplifier, the first PMOS transistor and the first NMOS transistor are controlled to be in a cutoff region, and the second PMOS transistor and the second NMOS transistor are configured as the fourth inverter.

In an embodiment, the control module further includes: a sixth switch, a first terminal of the sixth switch being connected to the second node, and a second terminal of the sixth switch being connected to the first bit line; and a seventh switch, a first terminal of the seventh switch being connected to the second bit line, and a second terminal of the seventh switch being connected to the first node. Herein, at the offset compensation stage of the sense amplifier, the sixth switch and the seventh switch are turned off; and at the first amplification stage of the sense amplifier, the first switch, the fourth switch and the fifth switch are turned off, and the second switch, the third switch, the sixth switch and the seventh switch are turned on.

In an embodiment, in the case of reading the data in the memory cell on the first bit line, at the first amplification stage of the sense amplifier, the source of the first PMOS transistor receives the first voltage, the source of the first NMOS transistor is grounded, and the source of the second PMOS transistor and the source of the second NMOS transistor receive a second voltage. Herein, the second voltage is less than the first voltage.

In an embodiment, in the case of reading the data in the memory cell on the second bit line, at the first amplification stage of the sense amplifier, the source of the second PMOS transistor receives the first voltage, the source of the second NMOS transistor is grounded, and the source of the first PMOS transistor and the source of the first NMOS transistor receive a second voltage. Herein, the second voltage is less than the first voltage.

In an embodiment, at a second amplification stage after the first amplification stage of the sense amplifier, the control module is arranged to configure the amplification module as a cross-coupled amplification structure.

In an embodiment, at the second amplification stage of the sense amplifier, the first switch, the fourth switch and the fifth switch are turned off, and the second switch, the third switch, the sixth switch and the seventh switch are turned on.

In an embodiment, at the second amplification stage of the sense amplifier, the source of the first PMOS transistor and the source of the second PMOS transistor receive the first voltage, and the source of the first NMOS transistor and the source of the second NMOS transistor are grounded.

In an embodiment, the sense amplifier further includes a precharge module arranged to precharge the first bit line and the second bit line at a precharge stage before the offset compensation stage of the sense amplifier.

In an embodiment, at the precharge stage of the sense amplifier, the first switch, the second switch, the third switch, the sixth switch and the seventh switch are turned off, and the fourth switch and the fifth switch are turned on.

In an embodiment, at the precharge stage of the sense amplifier, the source of the first PMOS transistor, the source of the second PMOS transistor, the source of the first NMOS transistor and the source of the second NMOS transistor receive a second voltage.

According to a second aspect of the disclosure, there is provided a memory, which includes the sense amplifier of any one of the above embodiments.

According to a third aspect of the disclosure, there is provided a method for controlling a sense amplifier including an amplification module and a control module. The method for controlling the sense amplifier includes the following operations. In a case of reading a data in a memory cell on a first bit line, at an offset compensation stage of the sense amplifier, the amplification module is configured to include a first diode structure, a first current mirror structure, and a first inverter with an input terminal and an output terminal connected to each other by the control module. In a case of reading a data in a memory cell on a second bit line, at the offset compensation stage of the sense amplifier, the amplification module is configured to include a second diode structure, a second current mirror structure, and a second inverter with an input terminal and an output terminal connected to each other by the control module.

In an embodiment, in the case of reading the data in the memory cell on the first bit line, at a first amplification stage of the sense amplifier, the amplification module is configured as a third inverter by the control module. In the case of reading the data in the memory cell on the second bit line, at the first amplification stage of the sense amplifier, the amplification module is configured as a fourth inverter by the control module.

In an embodiment, at a second amplification stage after the first amplification stage of the sense amplifier, the amplification module is configured as a cross-coupled amplification structure by the control module.

In the technical solutions provided by some embodiments of the disclosure, at the offset compensation stage of the sense amplifier, the amplification module is configured to include a diode structure, a current mirror structure, and an inverter with an input terminal and an output terminal connected to each other by means of the control of the control module, and different circuit structures are provided when reading different bit lines. Based on the circuit configuration in the disclosure, it is possible to adjust voltages of the bit lines on both sides of the sense amplifier, so as to compensate for the influence of the offset noise on the voltages of the bit lines on both sides of the sense amplifier, thereby improving the performance of the semiconductor memory.

It should be understood that the foregoing general description and the detailed description below are merely exemplary and explanatory, and do not limit the disclosure.

BRIEF DESCRIPTION OF THE DRAWINGS

The accompanying drawings herein are incorporated in and constitute a part of this specification, illustrate embodiments conforming to the disclosure, and, together with the description, serve to explain the principles of the disclosure. Apparently, the accompanying drawings in the following description show merely some embodiments of the disclosure, and persons of ordinary skill in the art may still derive other drawings from these accompanying drawings without creative efforts, in which.

DETAILED DESCRIPTION

Figure 1:
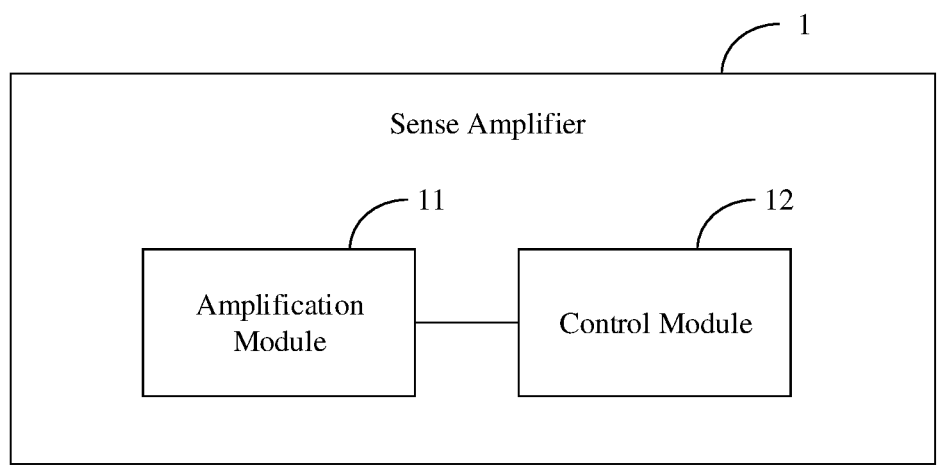
FIG. 1 schematically illustrates a block diagram of a sense amplifier according to an exemplary embodiment of the disclosure.

The exemplary embodiment will now be described more fully with reference to the accompanying drawings. However, the exemplary embodiments may be implemented in various forms and should not be construed as being limited to the examples set forth herein. Rather, the embodiments are provided so that the disclosure will be thorough and complete, and the concepts of the exemplary embodiments will be conveyed fully to those skilled in the art. The described features, structures or characteristics may be combined in one or more embodiments in any suitable manner. In the following description, numerous specific details are provided to give a thorough understanding of the embodiments of the disclosure. However, those skilled in the art will realize that the technical solutions of the disclosure may be practiced without one or more of the specific details, or other methods, components, devices, steps, or the like may be adopted. In other cases, well-known technical solutions have not been illustrated or described in detail to avoid obscuring aspects of the disclosure.

Furthermore, the drawings are merely schematic illustrations of the disclosure and are not necessarily drawn to scale. The same reference numerals in the drawings represent the same or similar parts, and thus repeated descriptions thereof will be omitted. The descriptions of "first", "second", "third", "fourth", "fifth", "sixth", "seventh", "eighth" and "ninth" are only intended to distinguish there-between, and should not be used to limit the disclosure.

It should be noted that the term "connect" as used in the disclosure may include direct connection and indirect connection. In the case of direct connection, there are no components between the terminals. For example, a first terminal of a switch A is connected to a first terminal of a switch B, and on the connection line between the first terminal of the switch A and the first terminal of the switch B, there may be only the connection line (e.g., metal line), without other components. In the case of indirect connection, there may be other components between the terminals. For example, a first terminal of a switch C may be connected to a first terminal of a switch D on the connection line between the first terminal of the switch C and the first terminal of the switch D, there may also be at least one of other components (e.g., a switch E, etc.), in addition to the connection line.

In the sense amplifier, the sizes, mobility, threshold voltages, and the like of the transistors may be different due to the difference of the manufacturing process and the influence of the operating environment. The performance of each transistor is usually not be exactly the same, which will cause the offset of the sense amplifier, which is equivalent to the occurrence of offset noise, thereby seriously affecting the correctness of the data read by the memory.

For example, the sense amplifier includes two NMOS transistors symmetrically arranged to one another. In an ideal state, it is desirable that the performance of these two NMOS transistors is exactly the same. However, in practice, the threshold voltages of these two NMOS transistors may be different from each other, which may result in offset of the circuit. In this case, if no measure is taken, it is possible to read the originally stored "1" as "0" and result in an error output, or to read the originally stored "0" as "1" and result in an error output, when reading the data from the memory cell.

In view of this, the disclosure provides a new sense amplifier.

FIG. 1 schematically illustrates a block diagram of a sense amplifier according to an exemplary embodiment of the disclosure. As illustrated in FIG. 1, the sense amplifier 1 may include an amplification module 11 and a control module 12.

The amplification module 11 may be configured to read a data in a memory cell on a first bit line or a second bit line.

The control module 12 is electrically connected to the amplification module 11.

In the case of reading the data in the memory cell on the first bit line, at an offset compensation stage of the sense amplifier, the control module 12 is arranged to configure the amplification module 11 to include a first diode structure, a first current mirror structure, and a first inverter with an input terminal and an output terminal connected to each other.

In the case of reading the data in the memory cell on the second bit line, at the offset compensation stage of the sense amplifier, the control module 12 is arranged to configure the amplification module 11 to include a second diode structure, a second current mirror structure, and a second inverter with an input terminal and an output terminal connected to each other.

In an exemplary embodiment of the disclosure, there is a difference between the first diode structure and the second diode structure at least in their circuit configurations. There is a difference between the first current mirror structure and the second current mirror structure at least in their circuit configurations. And there is a difference between the first inverter and the second inverter at least in their circuit configurations.

Based on the circuit configuration of the disclosure, it is possible to adjust voltages of the bit lines (at least one of the first bit line or the second bit line) on both sides of the sense amplifier, so as to compensate for the influence of the offset noise on the voltages of the bit lines on both sides of the sense amplifier, thereby improving the performance of the semiconductor memory.

It should be understood that the offset noise described in the disclosure refers to a voltage difference generated by the inconsistency between at least two transistors (or components) in the amplification module 11. In the case of synthesizing the voltage difference between all transistors (or components), the offset noise refers to the offset noise of the entire amplification module 11.

The amplification module 11 may include a first PMOS transistor (hereinafter simply referred to as transistor P1), a second PMOS transistor (hereinafter simply referred to as transistor P2), a first NMOS transistor (hereinafter simply referred to as transistor N1) and a second NMOS transistor (hereinafter simply referred to as transistor N2).

In this case, the offset noise may be the offset voltages of the transistor P1 and the transistor P2, or may be the offset voltages of the transistor N1 and the transistor N2, or may also be the offset voltage obtained by synthesizing the two offset voltages described above, which is not limited in the disclosure.

Figure 2:
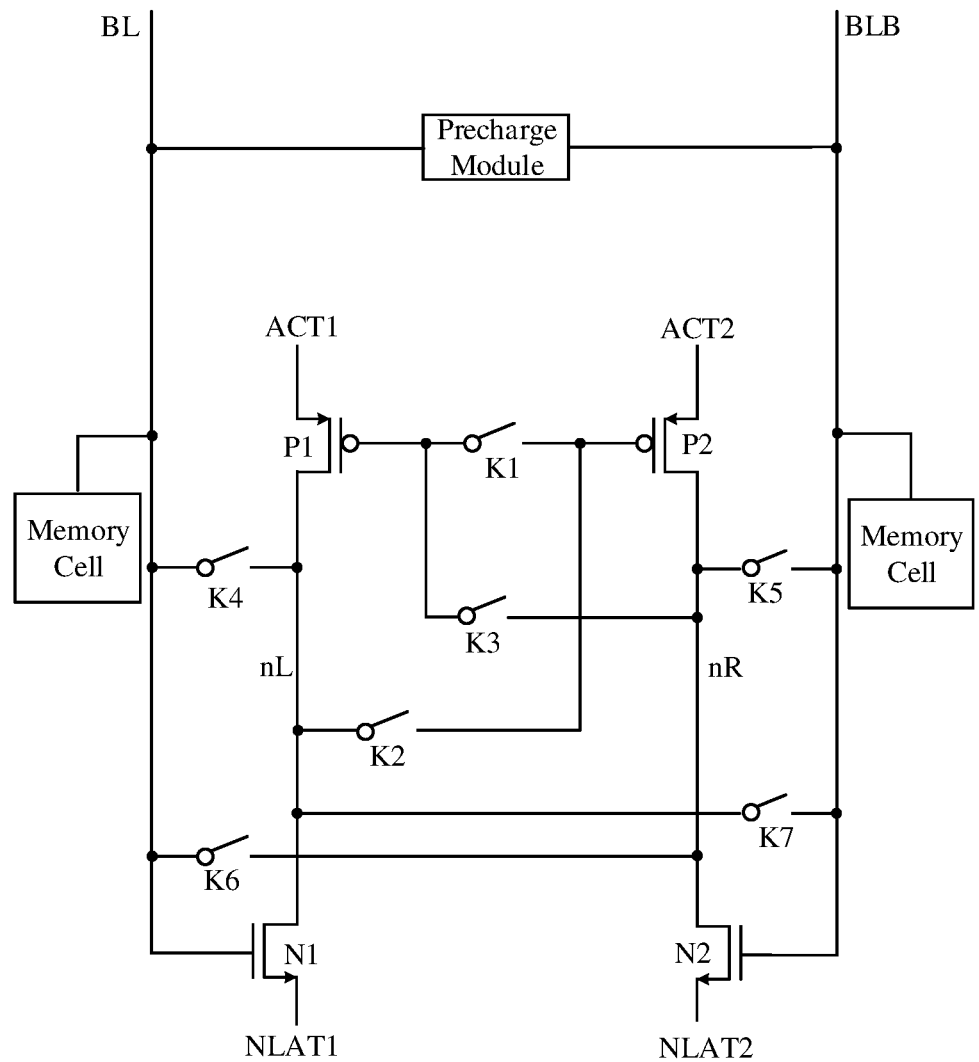
FIG. 2 schematically illustrates a circuit diagram of a sense amplifier according to an exemplary embodiment of the disclosure.

FIG. 2 schematically illustrates a circuit diagram of a sense amplifier according to an exemplary embodiment of the disclosure.

Referring to FIG. 2, a drain of the transistor P1 is connected to a drain of the transistor N1, and a drain of the transistor P2 is connected to a drain of the transistor N2. Furthermore, a gate of the transistor N1 is connected to the first bit line BL, and a gate of the transistor N2 is connected to the second bit line BLB.

For ease of the following description, a first node nL and a second node nR may be defined in the sense amplifier. The drain of the transistor P1 and the drain of the transistor N1 are connected to each other at the first node nL, and the drain of the transistor P2 and the drain of the transistor N2 are connected to each other at the second node nR.

The operation stage of the sense amplifier according to the exemplary embodiment of the disclosure may be divided into a precharge stage, an offset compensation stage, a first amplification stage and a second amplification stage.

In the case of reading the data in the memory cell on the first bit line BL, at the offset compensation stage of the sense amplifier, the transistor N2 is configured as the first diode structure, the transistor P1 and the transistor P2 are configured as the first current mirror structure, and the transistor P1 and the transistor N1 are configured as the first inverter with the input terminal and the output terminal connected to each other.

In the case of reading the data in the memory cell on the second bit line BLB, at the offset compensation stage of the sense amplifier, the transistor N1 is configured as the second diode structure, the transistor P1 and the transistor P2 are configured as the second current mirror structure, and the transistor P2 and the transistor N2 are configured as the second inverter with the input terminal and the output terminal connected to each other.

In the exemplary embodiments of the disclosure, the above configuration is implemented by means of a control module. Referring to FIG. 2, the control module may include a first switch (hereinafter simply referred to as switch K1), a second switch (hereinafter simply referred to as switch K2), a third switch (hereinafter simply referred to as switch K3), a fourth switch (hereinafter simply referred to as switch K4), and a fifth switch (hereinafter simply referred to as switch K5).

A first terminal of the switch K1 is connected to a gate of the transistor P1, and a second terminal of the switch K1 is connected to a gate of the transistor P2. A first terminal of the switch K2 is connected to the gate of the transistor P2, and a second terminal of the switch K2 is connected to the first node nL. A first terminal of the switch K3 is connected to the second node nR, and a second terminal of the switch K3 is connected to the gate of the transistor P1. A first terminal of the switch K4 is connected to the first node nL, and a second terminal of the switch K4 is connected to the first bit line BL. And a first terminal of the switch K5 is connected to the second bit line BLB, and a second terminal of the switch K5 is connected to the second node nR.

In the case of reading the data in the memory cell on the first bit line BL, at the offset compensation stage of the sense amplifier, the switch K1, the switch K2, the switch K4 and the switch K5 are turned on, and the switch K3 is turned off.

In the case of reading the data in the memory cell on the second bit line BLB, at the offset compensation stage of the sense amplifier, the switch K1, the switch K3, the switch K4 and the switch K5 are turned on, and the switch K2 is turned off.

Herein the types of the switch K1, the switch K2, the switch K3, the switch K4 and the switch K5 are not limited in the disclosure. For example, the switch K1 may be a PMOS transistor, an NMOS transistor or a Complementary Metal-Oxide-Semiconductor (CMOS) transmission gate. The switch K2 may be a PMOS transistor, an NMOS transistor or a CMOS transmission gate. The switch K3 may be a PMOS transistor, an NMOS transistor or a CMOS transmission gate. The switch K4 may be a PMOS transistor, an NMOS transistor or a CMOS transmission gate. And the switch K5 may be a PMOS transistor, an NMOS transistor or a CMOS transmission gate.

In some embodiments of the disclosure, the switch K1 may include a control terminal configured to control a switching state of the switch K1 in response to a first control signal (denoted as a control signal Current). The switch K2 may also include a control terminal configured to control a switching state of the switch K2 in response to a second control signal (denoted as a control signal CR). And the switch K3 may also include a control terminal configured to control a switching state of the switch K3 in response to a third control signal (denoted as a control signal CL).

The switch K4 may include a control terminal configured to control a switching state of the switch K4 in response to a fourth control signal (denoted as a control signal Tran). And the switch K5 may also include a control terminal configured to control a switching state of the switch K5 in response to the fourth control signal. That is, the control terminals of the switch K4 and the switch K5 may receive the fourth control signal.

Furthermore, a source of the transistor P1 may receive a fifth control signal (denoted as a control signal ACT1), a source of the transistor P2 may receive a sixth control signal (denoted as a control signal ACT2), a source of the transistor N1 may receive a seventh control signal (denoted as a control signal NLAT1), and a source of the transistor N2 may receive an eighth control signal (denoted as a control signal NLAT2).

The source of the transistor P1 and the source of the transistor P2 receive a first voltage at the offset compensation stage of the sense amplifier. Herein the first voltage may be a supply voltage VCC. That is, at this stage, each of the control signal ACT1 and the control signal ACT2 is configured as the first voltage.

At this stage, the source of the transistor N1 and the source of the transistor N2 are grounded. That is, the voltage received by the control signal NLAT1 and the control signal NLAT2 is zero.

Furthermore, in the case of reading the data in the memory cell on the first bit line BL, at a first amplification stage of the sense amplifier, the control module is arranged to configure the amplification module as a third inverter. Specifically, the transistor P2 and the transistor N2 are controlled to be in a cutoff region, and the transistor P1 and the transistor N1 are configured as the third inverter.

In the case of reading the data in the memory cell on the second bit line BLB, at a first amplification stage of the sense amplifier, the control module is arranged to configure the amplification module as a fourth inverter. Specifically, the transistor P1 and the transistor N1 are controlled to be in a cutoff region, and the transistor P2 and the transistor N2 are configured as the fourth inverter.

In this case, referring to FIG. 2, the sense amplifier of the disclosure may further include a sixth switch (hereinafter simply referred to as switch K6) and a seventh switch (hereinafter simply referred to as switch K7).

A first terminal of the switch K6 is connected to the second node nR, and a second terminal of the switch K6 is connected to the first bit line BL. And a first terminal of the switch K7 is connected to the second bit line BLB, and a second terminal of the switch K7 is connected to the first node nL.

Similarly, the types of the switch K6 and the switch K7 are not limited in the disclosure. For example, the switch K6 may be a PMOS transistor, an NMOS transistor or a CMOS transmission gate. And the switch K7 may be a PMOS transistor, an NMOS transistor or a CMOS transmission gate.

In some embodiments of the disclosure, the switch K6 may include a control terminal configured to control a switching state of the switch K6 in response to a ninth control signal (denoted as a control signal ISO). And the switch K7 may also include a control terminal configured to control a switching state of the switch K7 in response to the ninth control signal. That is, the control terminals of the switch K6 and the switch K7 may receive the ninth control signal.

At the offset compensation stage of the sense amplifier, the switch K6 and the switch K7 are turned off. At the first amplification stage of the sense amplifier, the switch K1, the switch K4 and the switch K5 are turned off, and the switch K2, the switch K3, the switch K6 and the switch K7 are turned on.

Furthermore, in the case of reading the data in the memory cell on the first bit line BL, at the first amplification stage of the sense amplifier, the source of the transistor P1 receives the first voltage, that is, the control signal ACT1 is VCC; the source of the transistor N1 is grounded; and the source of the transistor P2 and the source of the transistor N2 receive a second voltage. Due to the second voltage, the transistor P2 and the transistor N2 are in the cutoff region. Herein the second voltage is less than the first voltage. In an embodiment, the second voltage may be VCC/2.

In the case of reading the data in the memory cell on the second bit line BLB, at the first amplification stage of the sense amplifier, the source of the transistor P2 receives the first voltage, that is, the control signal ACT2 is VCC; the source of the transistor N2 is grounded; and the source of the transistor P1 and the source of the transistor N1 receive a second voltage. Due to the second voltage, the transistor P1 and the transistor N1 is in the cutoff region.

At a second amplification stage after the first amplification stage of the sense amplifier, the control module is further arranged to configure the amplification module as a cross-coupled amplification structure.

Specifically, at the second amplification stage, the switch K1, the switch K4 and the switch K5 are turned off, and the switch K2, the switch K3, the switch K6 and the switch K7 are turned on. Further, the source of the transistor P1 and the source of the transistor P2 receive the first voltage, that is, each of the control signal ACT1 and the control signal ACT2 is VCC. The source of the transistor N1 and the source of the transistor N2 are grounded, that is, each of the control signal NLAT1 and the control signal NLAT2 is zero.

Furthermore, the sense amplifier further includes a precharge module configured to precharge the first bit line and the second bit line at a precharge stage before the offset compensation stage of the sense amplifier.

At the precharge stage, the switch K1, the switch K2, the switch K3, the switch K6 and the switch K7 are turned off, and the switch K4 and the switch K5 are turned on. Further, the source of the transistor P1, the source of the transistor P2, the source of the transistor N1 and the source of the transistor N2 receive a second voltage.

It should be understood that the switch K4 and the switch 5 may also be turned off at the precharge stage. In this case, precharge may also be implemented by controlling the switch K6 and the switch K7 to be turned on.

Figure 3:
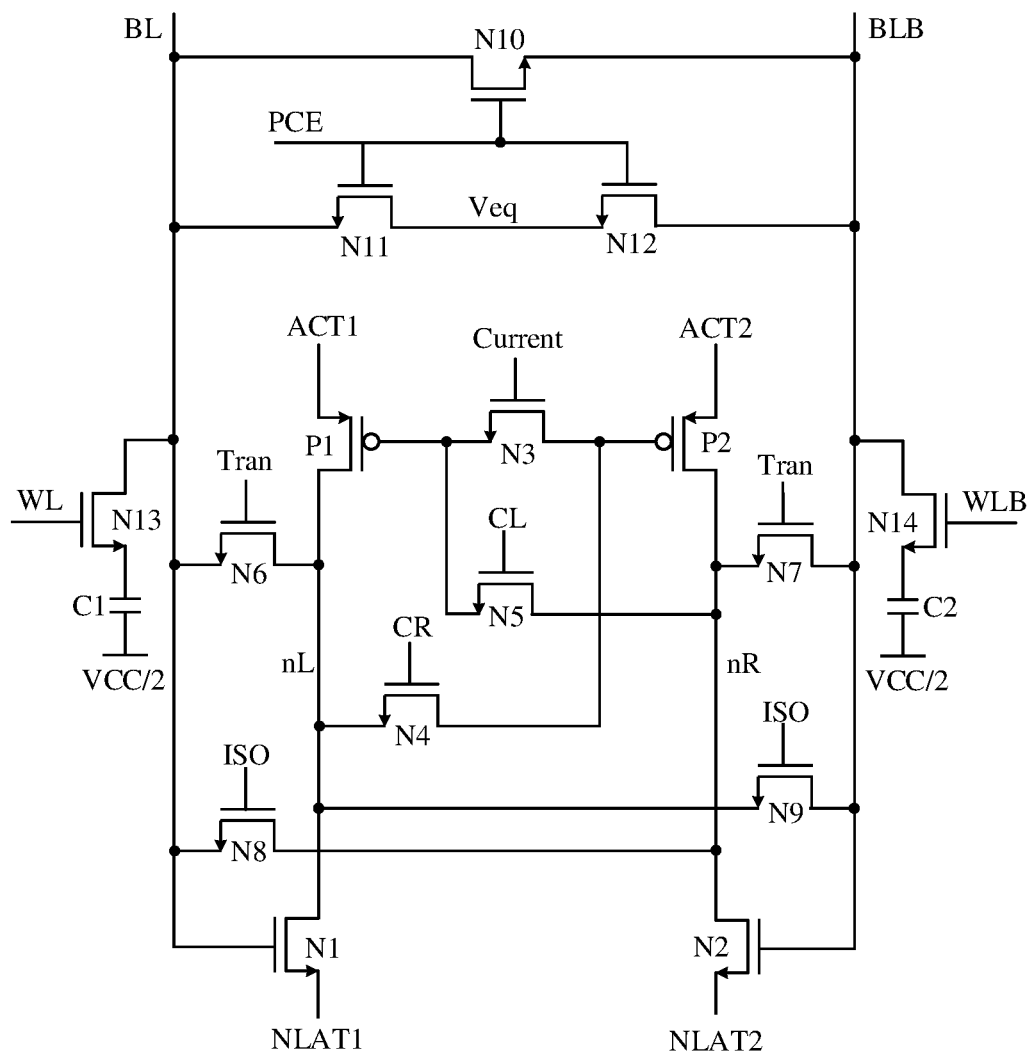
FIG. 3 schematically illustrates a circuit diagram of a specific configuration of a sense amplifier according to an embodiment of the disclosure.

FIG. 3 schematically illustrates a circuit diagram of a sense amplifier according to an embodiment of the disclosure.

In the embodiment illustrated in FIG. 3, the switch K1 is configured as the transistor N3 to control the switching state in response to the control signal Current. The switch K2 is configured as the transistor N4 to control the switching state in response to the control signal CR. The switch K3 is configured as the transistor N5 to control the switching state in response to the control signal CL. The switch K4 is configured as the transistor N6 to control the switching state in response to the control signal Tran. The switch K5 is configured as the transistor N7 to control the switching state in response to the control signal Tran. The switch K6 is configured as the transistor N8 to control the switching state in response to the control signal ISO. And the switch K7 is configured as the transistor N9 to control the switching state in response to the control signal ISO.

A precharge unit may include a transistor N10, a transistor N11 and a transistor N12.

The gate of the transistor N10, the gate of the transistor N11 and the gate of the transistor N12 may receive a precharge control signal PCE. A source of the transistor N10 is connected to the second bit line BLB, and a drain of the transistor N10 is connected to the first bit line BL. A source of the transistor N11 is connected to the first bit line BL, and a drain of the transistor N11 is connected to a source of the transistor N12 and connected to a precharge voltage Veq. Herein the precharge voltage Veq may be configured as VCC/2. A drain of the transistor N12 is connected to the second bit line BLB.

A memory cell corresponding to the first bit line BL is configured to include a transistor N13 and a capacitor C1. The transistor N13 controls the switching state in response to a word line control signal WL. A memory cell corresponding to the second bit line BLB is configured to include a transistor N14 and a capacitor C2. The transistor N14 controls the switching state in response to a word line control signal WLB.

The process of reading the data on the first bit line BL and the process of reading the data on the second bit line BLB will be described below respectively.

Figure 4:
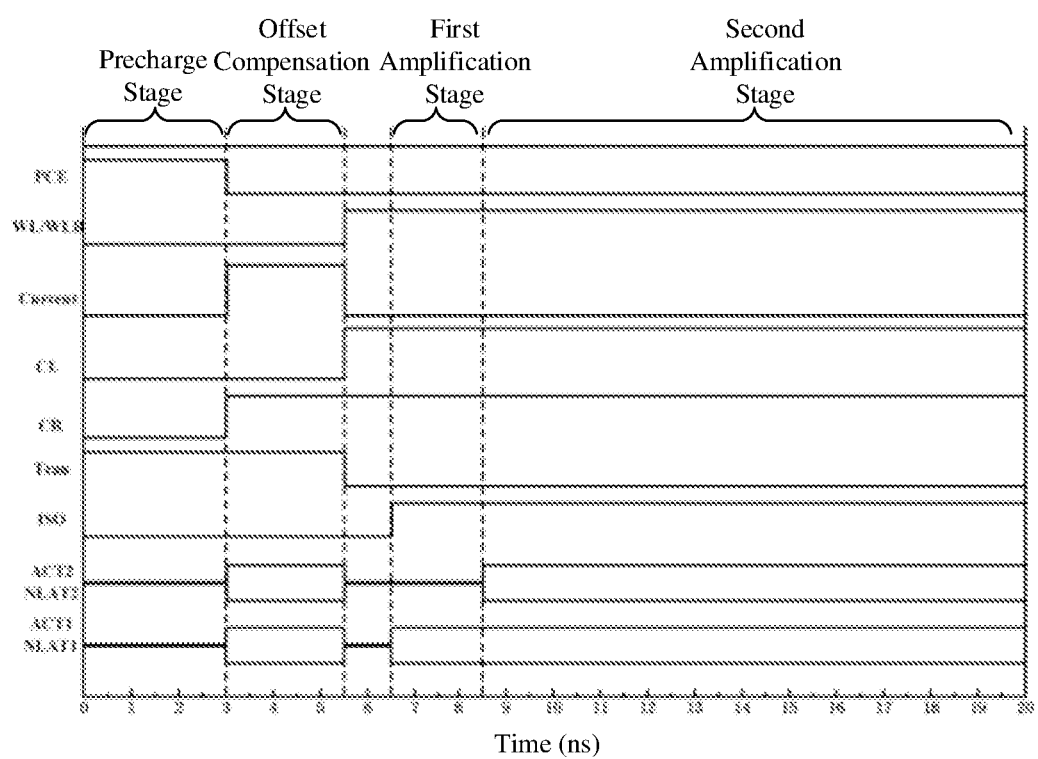
FIG. 4 schematically illustrates a timing diagram of various control signals involved in a sense amplifier in a case of reading a data in a memory cell on a first bit line according to an embodiment of the disclosure.

FIG. 4 schematically illustrates a timing diagram of various control signals involved in a sense amplifier in the case of reading a data in a memory cell on a first bit line BL according to an embodiment of the disclosure. It should be noted that FIG. 4 is merely a schematic diagram, and the time values shown in the abscissa of FIG. 4 are not intended to limit the embodiments of the disclosure.

The operation stages of the sense amplifier in the case of reading the data in the memory cell on the first bit line BL according to the embodiment of the disclosure will be described below with reference to the timing diagram of FIG. 4.

Figure 5:
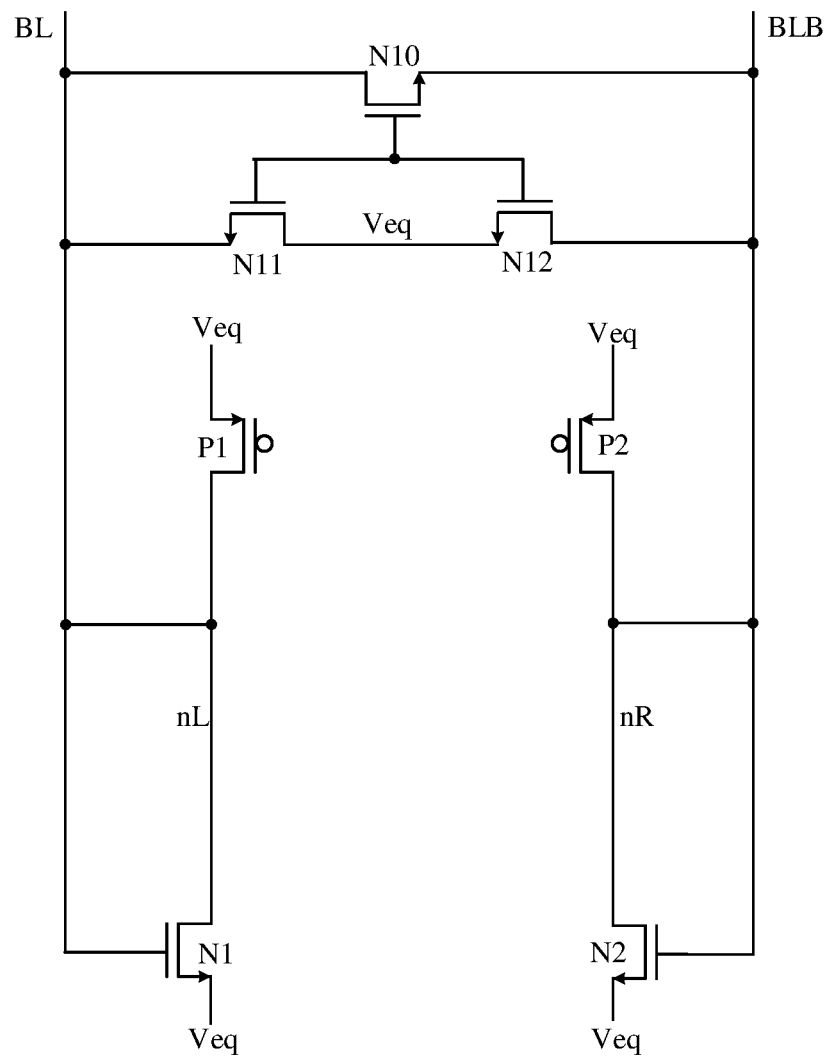
FIG. 5 schematically illustrates a circuit diagram of a sense amplifier at a precharge stage in a case of reading a data in a memory cell on a first bit line according to an embodiment of the disclosure.

FIG. 5 is directed to a precharge stage of the sense amplifier in the case of reading a data in the memory cell on the first bit line BL. The voltages of the control signal PCE, the control signal Tran, the control signal ACT1, the control signal ACT2, the control signal NLAT1 and the control signal NLAT2 may be 1.5 times VCC, 1.5 times VCC, VCC/2, VCC/2, VCC/2 and VCC/2 respectively, and the voltages of the remaining control signals are zero.

Correspondingly, the transistor N10, the transistor N11, the transistor N12, the transistor N6 and the transistor N7 are turned on (corresponding to the turned-on state of the switch). The transistor N3, the transistor N4, the transistor N5, the transistor N8 and the transistor N9 are turned off (corresponding to the turned-off state of the switch).

In this case, the first bit line BL and the second bit line BLB are connected to the precharge voltage Veq through the transistor N11 and the transistor N12 respectively, and are connected to each other through the transistor N10, so that the first bit line BL and the second bit line BLB are precharged to Veq. Furthermore, since the transistor N6 and the transistor N7 are turned on, the first node nL and the second node nR are also precharged to Veq.

It should be noted that at the precharge stage, the transistor N3, the transistor N4, the transistor N5, the transistor N8 and the transistor N9 may also be in the turned-on state, which may be set as required.

Figure 6:
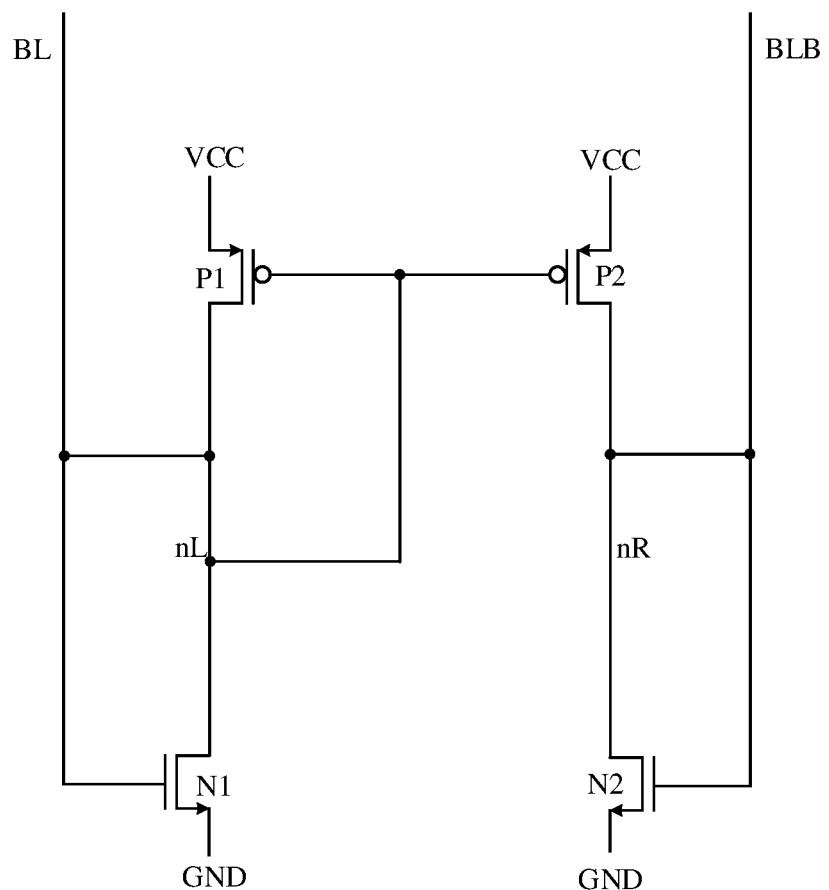
FIG. 6 schematically illustrates a circuit diagram of a sense amplifier at an offset compensation stage in a case of reading a data in a memory cell on a first bit line according to an embodiment of the disclosure.

FIG. 6 is directed to an offset compensation stage of the sense amplifier in the case of reading a data in the memory cell on the first bit line BL. The voltages of the control signal ACT1, the control signal NLAT1, the control signal ACT2, the control signal NLAT2, the control signal Tran, the control signal CR and the control signal Current are VCC, 0, VCC, 0, 1.5 times VCC, VCC and VCC respectively.

In this case, the transistor N4, the transistor N6 and the transistor N7 are turned on. Thus, the transistor P1 and the transistor N1 form an inverter with an input terminal and an output terminal connected to each other. Since the transistor N4 is turned on, the transistor P1 and the transistor P2 forms a current mirror structure.

After the precharge stage, if there is a mismatch problem in the circuit, that is, there is a mismatch caused by inconsistency between the transistor P1 and the transistor P2 or a mismatch caused by inconsistency between the transistor N1 and the transistor N2, the current flowing through the transistor P1 and the transistor N1 is not equal to the current flowing through the transistor P2 and the transistor N2. That is, the drive capabilities of the two inverters are different from each other, thereby increasing the erroneous reading rate of data.

With the offset compensation stage illustrated in FIG. 6, based on the inverter with the input terminal and the output terminal connected to each other, the first bit line BL may be compensated to an inversion point of the inverter, and the inversion voltage may be varied based on the degree of offset. Furthermore, the inversion voltage of the inverter composed of the transistor P1 and the transistor N1 is the gate voltage of the transistor P2. In this case, the transistor P1 and the transistor P2 form a current mirror structure, so that the current on the branch of the transistor P1 and the transistor N1 is approximately equal to the current on the branch of the transistor P2 and the transistor N2. For the transistor N2, the gate and the drain thereof are connected to one another, so that a diode structure is formed. And the transistor N2 is connected to the second bit line BLB, so that the voltage of the second bit line BLB is compensated. In this case, the voltage on the second bit line BLB varies, so that the overdrive voltage of the transistor N2 varies, so as to meet the requirements of the current mirror.

Figure 7:
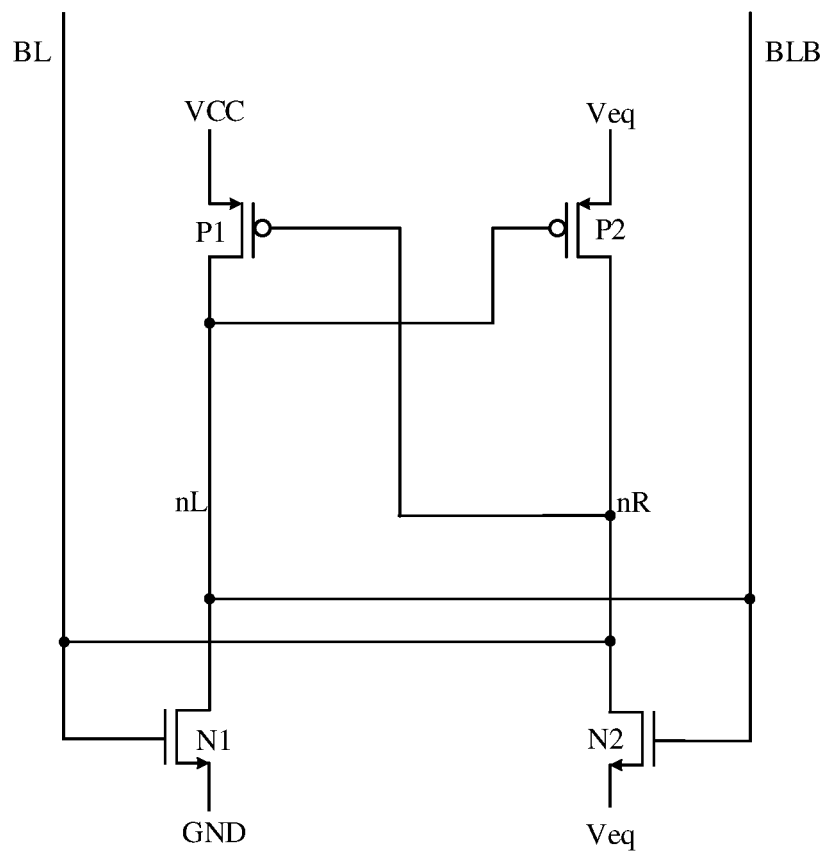
FIG. 7 schematically illustrates a circuit diagram of a sense amplifier at a first amplification stage in a case of reading a data in a memory cell on a first bit line according to an embodiment of the disclosure.

FIG. 7 is directed to a first amplification stage of the sense amplifier in the case of reading a data in the memory cell on the first bit line BL. The voltages of the control signal ACT1, the control signal NLAT1, the control signal ACT2, the control signal NLAT2, the control signal CL, the control signal CR and the control signal ISO are VCC, 0, VCC/2, VCC/2, VCC, VCC and 1.5 times VCC respectively.

Correspondingly, the transistor N4, the transistor N5, the transistor N8 and the transistor N9 are turned on. Moreover, since the voltages of the control signal ACT1 and the control signal NLAT1 are VCC and 0 respectively, the transistor P1 and the transistor N1 form an inverter. An input terminal of the inverter is configured as the first bit line BL, and an output terminal of the inverter is configured as the second bit line BLB. Furthermore, since each of the voltage of the control signal ACT2 and the voltage of the control signal NLAT2 is Veq (VCC/2), the transistor P2 and the transistor N2 are in the cutoff region, that is, the transistor P2 and the transistor N2 are inoperative.

If the sense amplifier reads 0 from the memory cell on the first bit line BL, after the word line control signal WL is at a high level, the voltage of the first bit line BL is decreased. That is, the input terminal of the inverter composed of the transistor P1 and the transistor N1 is at a relatively low level. The voltage at the output terminal of the inverter is increased continuously at the first amplification stage due to the inverter. That is, the voltage of the second bit line BLB is increased continuously.

If the sense amplifier reads 1 from the memory cell on the first bit line BL, after the word line control signal WL is at a high level, the voltage of the first bit line BL is increased. That is, the input terminal of the inverter composed of the transistor P1 and the transistor N1 is at a relatively high level. The voltage at the output terminal of the inverter is decreased continuously at the first amplification stage due to the inverter. That is, the voltage of the second bit line BLB is decreased continuously.

Therefore, at the first amplification stage of the sense amplifier of the disclosure, the voltage difference between the first bit line BL and the second bit line BLB is greatly increased, which contributes to further amplify the voltage difference between the first bit line BL and the second bit line BLB, thereby increasing the data reading speed, and avoiding erroneous amplification of data.

Figure 8:
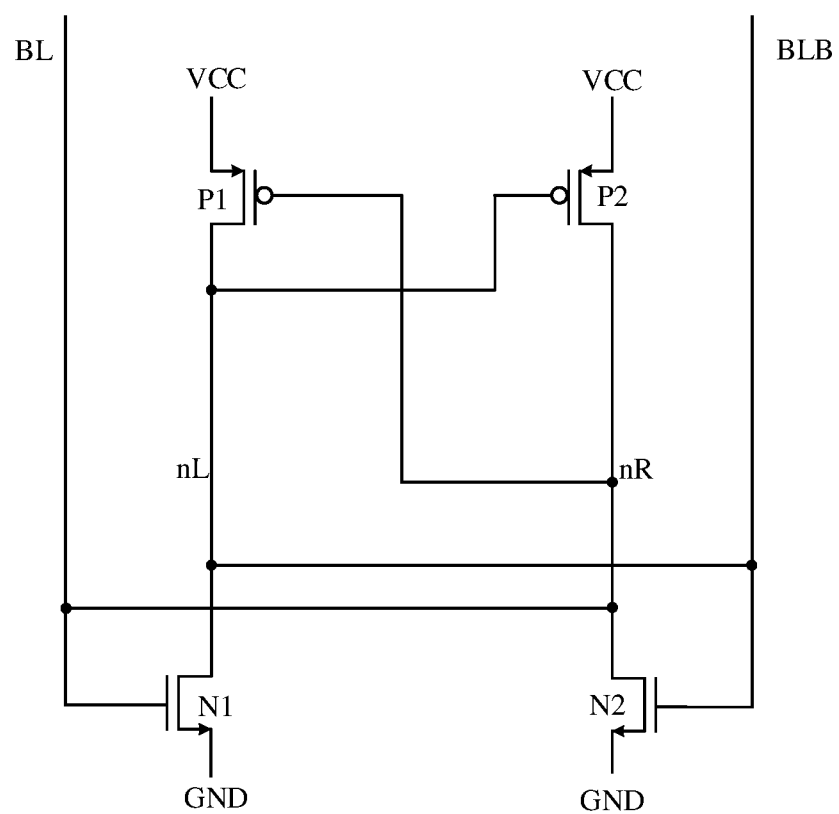
FIG. 8 schematically illustrates a circuit diagram of a sense amplifier at a second amplification stage in a case of reading a data in a memory cell on a first bit line according to an embodiment of the disclosure.

FIG. 8 is directed to a second amplification stage of the sense amplifier in the case of reading a data in the memory cell on the first bit line BL. The voltages of the control signal ACT1, the control signal NLAT1, the control signal ACT2, the control signal NLAT2, the control signal CL, the control signal CR and the control signal ISO are VCC, 0, VCC, 0, VCC, VCC and 1.5 times VCC respectively. Compared with the circuit configuration illustrated in FIG. 7, the voltages of the control signal ACT2 and the control signal NLAT2 are switched to VCC and 0 respectively. Therefore, the transistor P1, the transistor P2, the transistor N1 and the transistor N2 form a cross-coupled amplification structure.

If the sense amplifier reads 0 from the memory cell on the first bit line BL, the voltage on the first bit line BL is lower than the voltage on the second bit line BLB. In this case, the transistor N2 and the transistor N8 are turned on, and the voltage on the first bit line BL may be discharged to ground through the transistor N2. Furthermore, the transistor P1 is turned on, and the voltage on the second bit line BLB is increased to VCC.

If the sense amplifier reads 1 from the memory cell on the first bit line BL, the voltage on the first bit line BL is higher than the voltage on the second bit line BLB. In this case, the transistor N1 and the transistor N9 are turned on, and the voltage on the second bit line BLB may be discharged to ground through the transistor N1. Furthermore, the transistor P2 is turned on, and the voltage on the first bit line BL is increased to VCC.

Therefore, with such a cross-coupled amplification structure, the small voltage difference read by the bit line from the memory cell may be amplified to the full swing (0 or 1).

It should be noted that a transition stage may also be included between the offset compensation stage and the first amplification stage. At the transition stage, the word line is in the turned-off state, the ninth control signal ISO is in the low state, and the transistor N8 and the transistor N9 are in the turned-off state, which facilitates the charge in the memory cell to be sufficiently shared to the first bit line or the second bit line after the word line is turned off. However, it is not limited thereto, and it may be set as required.

Figure 9:
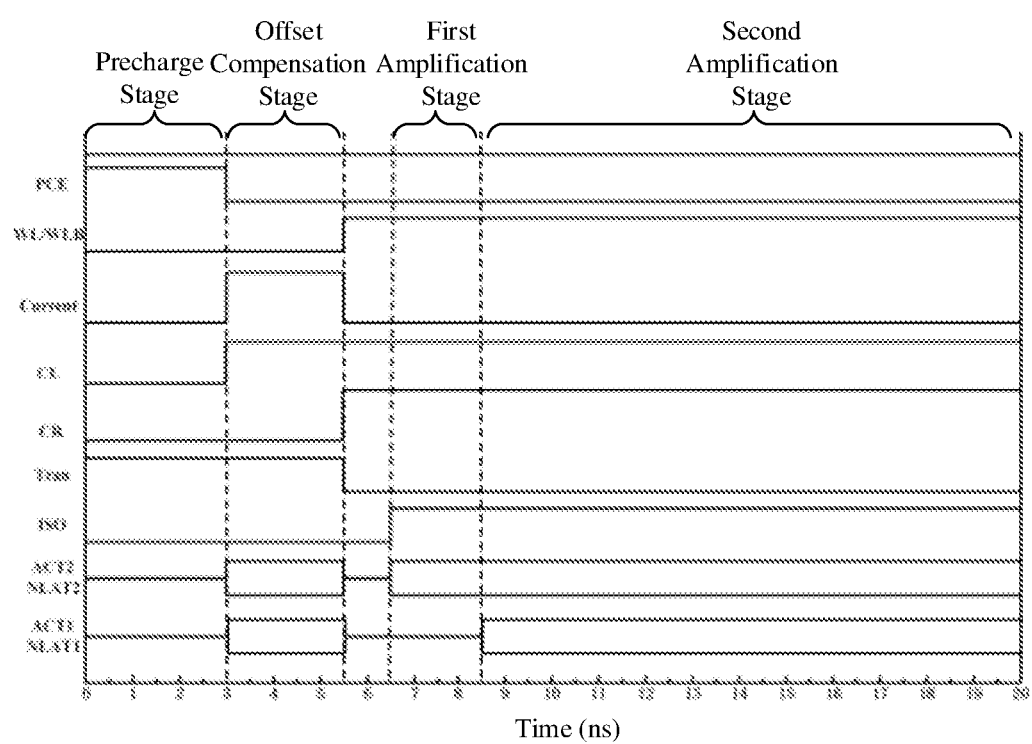
FIG. 9 schematically illustrates a timing diagram of various control signals involved in a sense amplifier in a case of reading a data in a memory cell on a second bit line according to an embodiment of the disclosure.

FIG. 9 schematically illustrates a timing diagram of various control signals involved in a sense amplifier in the case of reading a data in a memory cell on a second bit line BLB according to an embodiment of the disclosure. It should be noted that FIG. 9 is merely a schematic diagram, and the time values shown in the abscissa of FIG. 9 are not intended to limit the embodiments of the disclosure.

The operation stages of the sense amplifier in the case of reading the data in the memory cell on the second bit line BLB according to the embodiment of the disclosure will be described below with reference to the timing diagram of FIG. 9.

Figure 10:
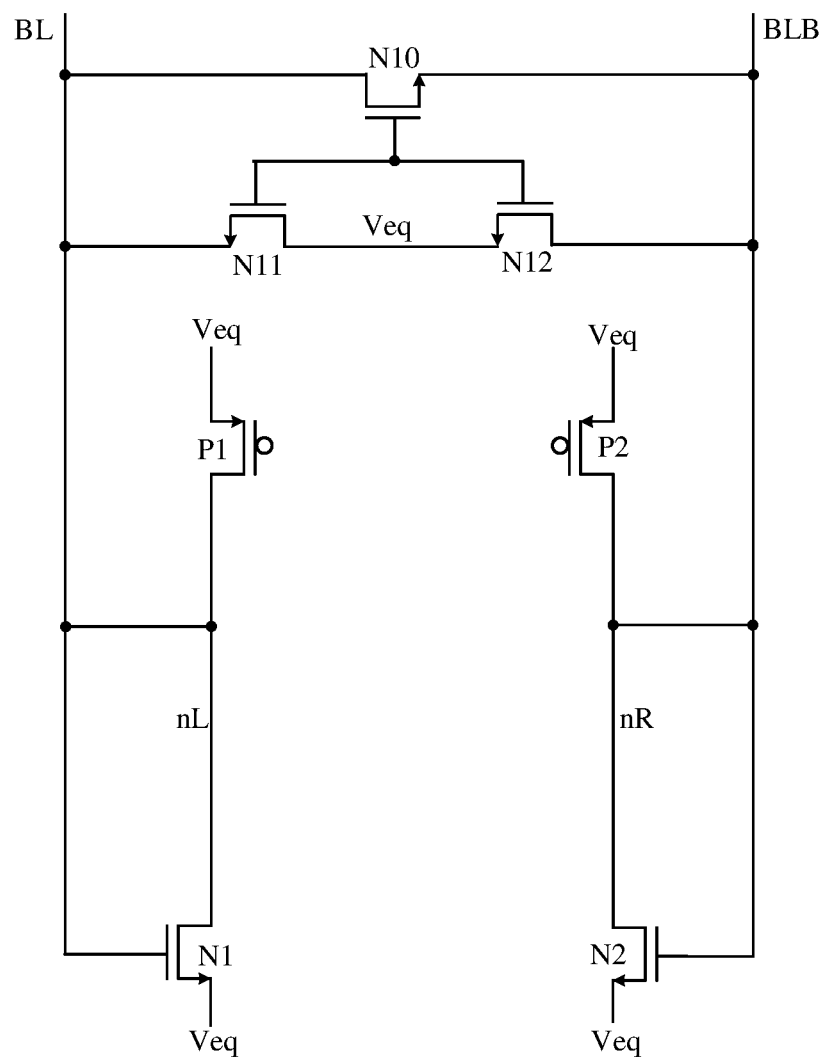
FIG. 10 schematically illustrates a circuit diagram of a sense amplifier at a precharge stage in a case of reading a data in a memory cell on a second bit line according to an embodiment of the disclosure.

FIG. 10 is directed to a precharge stage of the sense amplifier in the case of reading a data in the memory cell on the second bit line BLB. The precharge process is the same as the process described above referring to FIG. 5, which will not be repeated herein.

Figure 11:
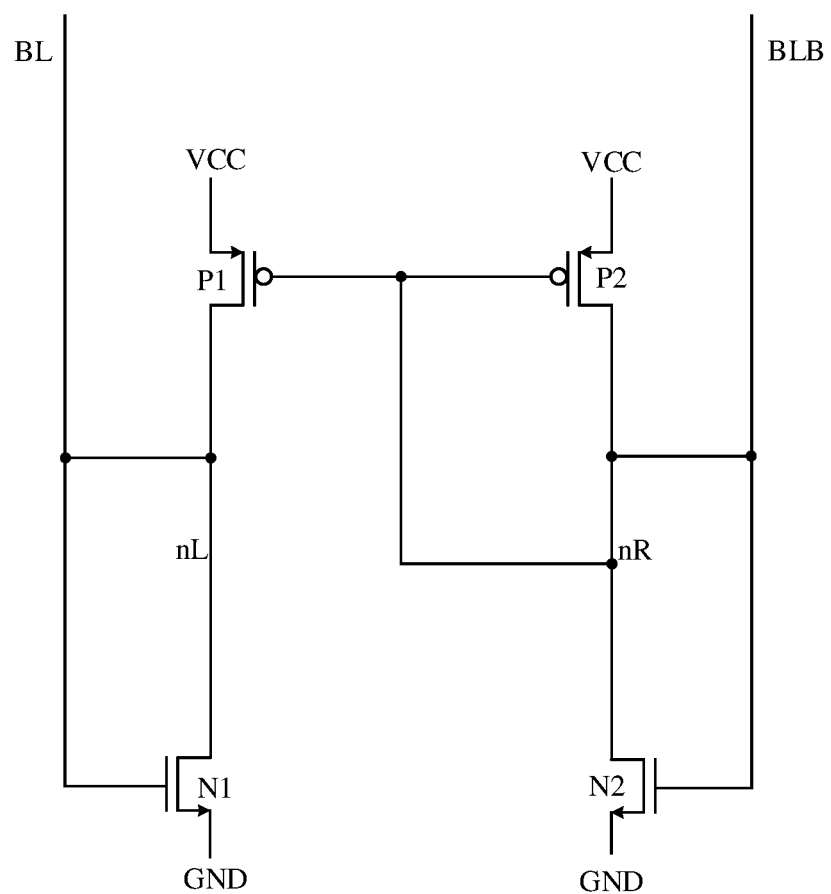
FIG. 11 schematically illustrates a circuit diagram of a sense amplifier at an offset compensation stage in a case of reading a data in a memory cell on a second bit line according to an embodiment of the disclosure.

FIG. 11 is directed to an offset compensation stage of the sense amplifier in the case of reading a data in the memory cell on the second bit line BLB. The voltages of the control signal ACT1, the control signal NLAT1, the control signal ACT2, the control signal NLAT2, the control signal Tran, the control signal CL and the control signal Current are VCC, 0, VCC, 0, 1.5 times VCC, VCC and VCC respectively.

In this case, the transistor N5, the transistor N6 and the transistor N7 are turned on. Thus, the transistor P2 and the transistor N2 form an inverter with an input terminal and an output terminal connected to each other. Since the transistor N5 is turned on, the transistor P1 and the transistor P2 forms a current mirror structure.

After the precharge stage, if there is a mismatch problem in the circuit, that is, there is a mismatch caused by inconsistency between the transistor P1 and the transistor P2 or a mismatch caused by inconsistency between the transistor N1 and the transistor N2, the current flowing through the transistor P1 and the transistor N1 is not equal to the current flowing through the transistor P2 and the transistor N2. That is, the drive capabilities of the two inverters are different from each other, thereby increasing the erroneous reading rate of data.

With the offset compensation stage illustrated in FIG. 11, based on the inverter with the input terminal and the output terminal connected to each other, the reading on the second bit line BLB may be compensated to an inversion point of the inverter, and the inversion voltage may be varied based on the degree of offset. Furthermore, the inversion voltage of the inverter composed of the transistor P2 and the transistor N2 is the gate voltage of the transistor P1. In this case, the transistor P1 and the transistor P2 form a current mirror structure, so that the current on the branch of the transistor P1 and the transistor N1 is approximately equal to the current on the branch of the transistor P2 and the transistor N2. For the transistor N1, the gate and the drain thereof are connected to one another, so that a diode structure is formed. And the transistor N1 is connected to the first bit line BL, so that the voltage of the first bit line BL is compensated. In this case, the voltage on the first bit line BL varies, so that the overdrive voltage of the transistor N1 varies, so as to meet the requirements of the current mirror.

Figure 12:
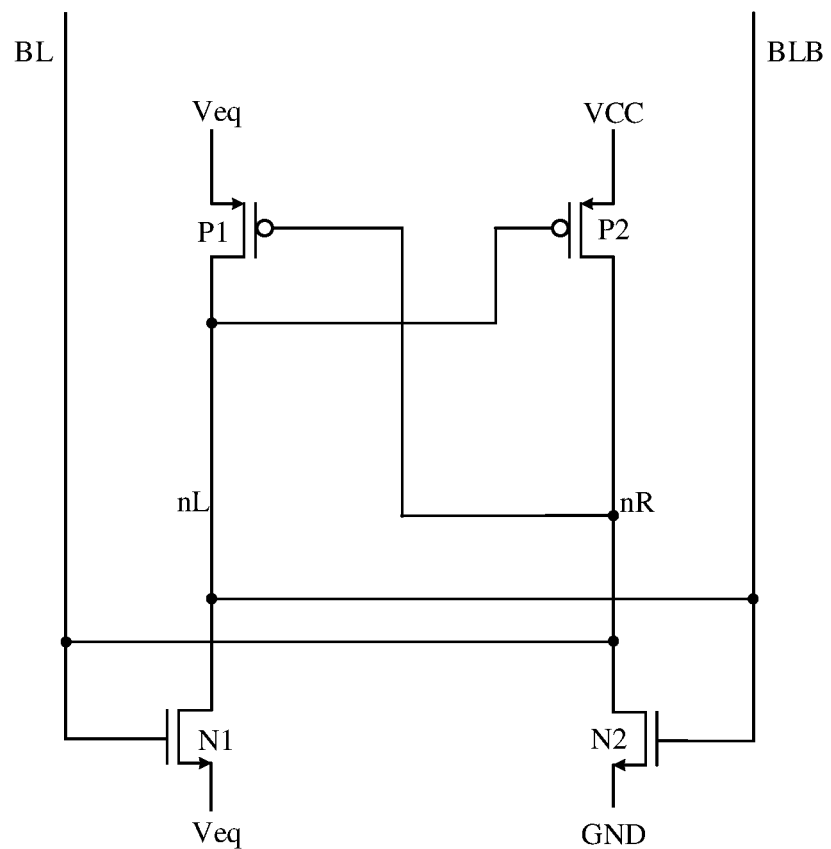
FIG. 12 schematically illustrates a circuit diagram of a sense amplifier at a first amplification stage in a case of reading a data in a memory cell on a second bit line according to an embodiment of the disclosure.

FIG. 12 is directed to a first amplification stage of the sense amplifier in the case of reading a data in the memory cell on the second bit line BLB. The voltages of the control signal ACT1, the control signal NLAT1, the control signal ACT2, the control signal NLAT2, the control signal CL, the control signal CR and the control signal ISO are VCC/2, VCC/2, VCC, 0, VCC, VCC and 1.5 times VCC respectively.

Correspondingly, the transistor N4, the transistor N5, the transistor N8 and the transistor N9 are turned on. Moreover, since the voltages of the control signal ACT2 and the control signal NLAT2 are VCC and 0 respectively, the transistor P2 and the transistor N2 form an inverter. An input terminal of the inverter is configured as the second bit line BLB, and an output terminal of the inverter is configured as the first bit line BL. Furthermore, since each of the voltage of the control signal ACT1 and the voltage of the control signal NLAT1 is Veq (VCC/2), the transistor P1 and the transistor N1 are in the cutoff region, that is, the transistor P1 and the transistor N1 are inoperative.

If the sense amplifier reads 0 from the memory cell on the second bit line BLB, after the word line control signal WLB is at a high level, the voltage of the second bit line BLB is decreased. That is, the input terminal of the inverter composed of the transistor P2 and the transistor N2 is at a relatively low level. The voltage at the output terminal of the inverter is increased continuously at the first amplification stage due to the inverter. That is, the voltage of the first bit line BL is increased continuously.

If the sense amplifier read 1 from the memory cell on the second bit line BLB, after the word line control signal WLB is at a high level, the voltage of the second bit line BLB is increased. That is, the input terminal of the inverter composed of the transistor P2 and the transistor N2 is at a relatively high level. The voltage at the output terminal of the inverter is decreased continuously at the first amplification stage due to the inverter. That is, the voltage of the first bit line BL is decreased continuously.

Therefore, at the first amplification stage of the sense amplifier of the disclosure, the voltage difference between the first bit line BL and the second bit line BLB is greatly increased, which contributes to further amplify the voltage difference between the first bit line BL and the second bit line BLB, thereby increasing the data reading speed, and avoiding erroneous amplification of data.

Figure 13:
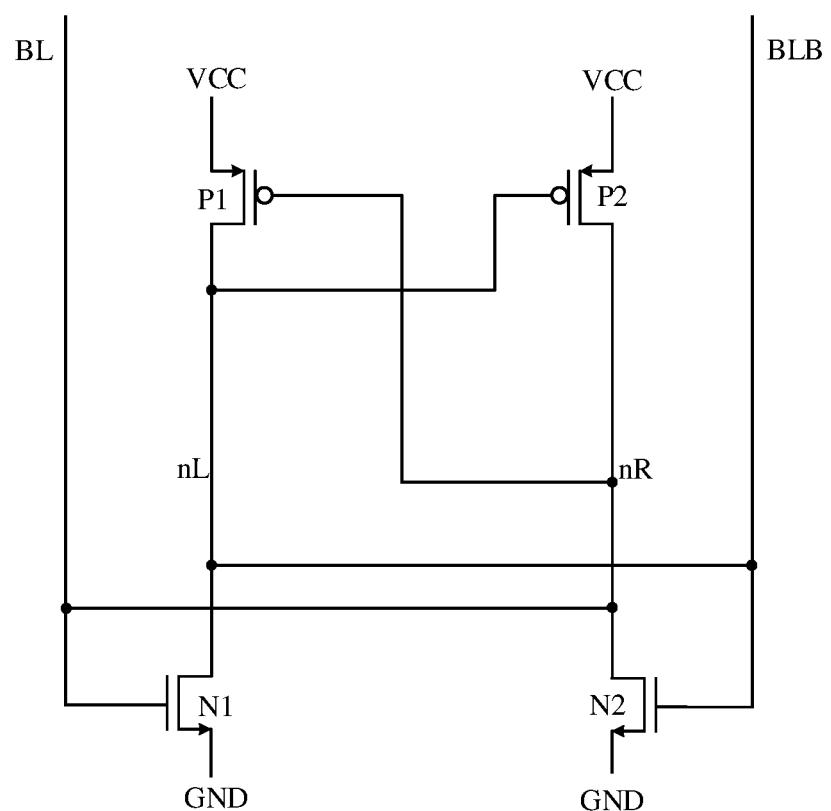
FIG. 13 schematically illustrates a circuit diagram of a sense amplifier at a second amplification stage in a case of reading a data in a memory cell on a second bit line according to an embodiment of the disclosure.

FIG. 13 is directed to a second amplification stage of the sense amplifier in the case of reading a data in the memory cell on the second bit line BLB. The second amplification stage of FIG. 13 is the same as the process described above referring to FIG. 8, which will not be repeated herein.

It should be noted that a transition stage may also be included between the offset compensation stage and the first amplification stage. At the transition stage, the word line is in the turned-off state, the ninth control signal ISO is in the low state, and the transistor N8 and the transistor N9 are in the turned-off state, which facilitates the charge in the memory cell to be sufficiently shared to the first bit line or the second bit line after the word line is turned off. However, it is not limited thereto, and it may be set as required.

Further, the disclosure also provides a method for controlling a sense amplifier.

Figure 14:
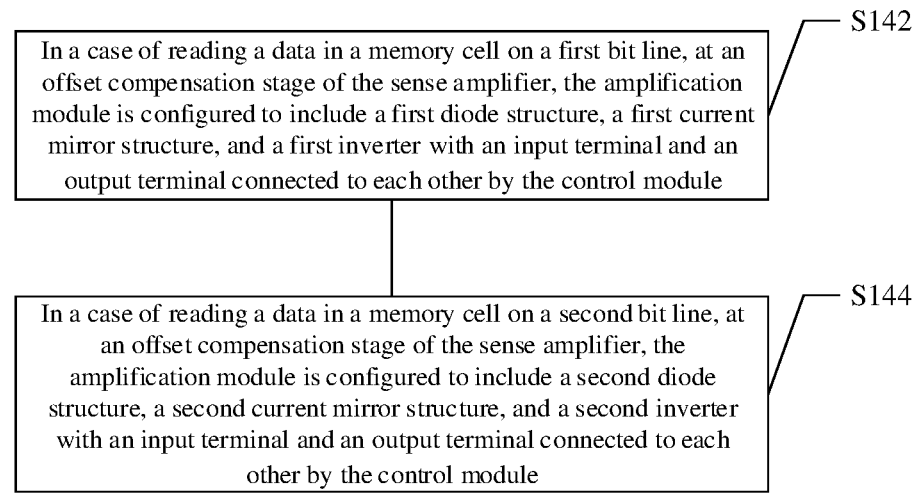
FIG. 14 schematically illustrates a flow chart of a method for controlling a sense amplifier according to an exemplary embodiment of the disclosure.

FIG. 14 schematically illustrates a flow chart of a method for controlling a sense amplifier according to an exemplary embodiment of the disclosure. As described above, the sense amplifier may include an amplification module and a control module.

Referring to FIG. 14, the method for controlling the sense amplifier may include the following operations.

In S142, in a case of reading a data in a memory cell on a first bit line, at an offset compensation stage of the sense amplifier, the amplification module is configured to include a first diode structure, a first current mirror structure, and a first inverter with an input terminal and an output terminal connected to each other by the control module.

In S144, in a case of reading a data in a memory cell on a second bit line, at the offset compensation stage of the sense amplifier, the amplification module is configured to include a second diode structure, a second current mirror structure, and a second inverter with an input terminal and an output terminal connected to each other by the control module.

According to an exemplary embodiment of the disclosure, in the case of reading the data in the memory cell on the first bit line, at a first amplification stage of the sense amplifier, the amplification module is configured as a third inverter by the control module. And in the case of reading the data in the memory cell on the second bit line, at the first amplification stage of the sense amplifier, the amplification module is configured as a fourth inverter by the control module.

According to an exemplary embodiment of the disclosure, at a second amplification stage after the first amplification stage of the sense amplifier, the amplification module is configured as a cross-coupled amplification structure by the control module.

As described above, the sense amplifier may also include a precharge stage. The details of these stages are explained in the above description of the configuration of the sense amplifier, which will not be repeated herein.

By using the method for controlling the sense amplifier according to the exemplary embodiment of the disclosure, it is possible to adjust the voltages of the bit lines on both sides of the sense amplifier respectively, according to the difference between the data read on the first bit line and the data read on the second bit line, so that the influence of the offset noise on the voltages of the bit lines on both sides of the sense amplifier is compensated, thereby improving the performance of the semiconductor memory.

Further, the disclosure also provides a memory, which includes the above-described sense amplifier.

With the memory according to the exemplary embodiment of the disclosure, the offset compensation is better achieved, and erroneous reading rate is lowered, thereby greatly improving the performance of the memory.

Other embodiments of the disclosure will be apparent to those skilled in the art from consideration of the specification and practice of the disclosure disclosed here. The disclosure is intended to cover any variations, uses, or adaptations of the disclosure following the general principles thereof and including such departures from the disclosure as come within known or customary practice in the art. It is intended that the specification and embodiments are considered as exemplary only, with a true scope and spirit of the disclosure being indicated by the following claims.

It will be appreciated that the disclosure is not limited to the exact construction that has been described above and illustrated in the accompanying drawings, and that various modifications and changes can be made without departing from the scope thereof. It is intended that the scope of the disclosure only be limited by the appended claims.

The invention claimed is:

1. A sense amplifier, comprising:
an amplification circuit arranged to read a data in a memory cell on a first bit line or a second bit line; and
a control circuit, electrically connected to the amplification circuit;
wherein in a case of reading the data in the memory cell on the first bit line, at an offset compensation stage of the sense amplifier, the control circuit is arranged to configure the amplification circuit to comprise a first diode structure, a first current mirror structure, and a first inverter with an input terminal and an output terminal connected to each other;
in a case of reading the data in the memory cell on the second bit line, at the offset compensation stage of the sense amplifier, the control circuit is arranged to configure the amplification circuit to comprise a second diode structure, a second current mirror structure, and a second inverter with an input terminal and an output terminal connected to each other.

2. The sense amplifier of claim 1, wherein the amplification circuit comprises:
a first P-channel Metal Oxide Semiconductor (PMOS) transistor;
a second PMOS transistor;
a first N-channel Metal Oxide Semiconductor (NMOS) transistor, a gate of the first NMOS transistor being connected to the first bit line, and a drain of the first NMOS transistor being connected to a drain of the first PMOS transistor through a first node; and
a second NMOS transistor, a gate of the second NMOS transistor being connected to the second bit line, and a drain of the second NMOS transistor being connected to a drain of the second PMOS transistor through a second node;
wherein in the case of reading the data in the memory cell on the first bit line, at the offset compensation stage of the sense amplifier, the second NMOS transistor is configured as the first diode structure, the first PMOS transistor and the second PMOS transistor are configured as the first current mirror structure, and the first PMOS transistor and the first NMOS transistor are configured as the first inverter with the input terminal and the output terminal connected to each other;
in the case of reading the data in the memory cell on the second bit line, at the offset compensation stage of the sense amplifier, the first NMOS transistor is configured as the second diode structure, the first PMOS transistor and the second PMOS transistor are configured as the second current mirror structure, and the second PMOS transistor and the second NMOS transistor are configured as the second inverter with the input terminal and the output terminal connected to each other.

3. The sense amplifier of claim 2, wherein the control circuit comprises:
a first switch, a first terminal of the first switch being connected to a gate of the first PMOS transistor, and a second terminal of the first switch being connected to a gate of the second PMOS transistor;
a second switch, a first terminal of the second switch being connected to the gate of the second PMOS transistor, and a second terminal of the second switch being connected to the first node;
a third switch, a first terminal of the third switch being connected to the second node, and a second terminal of the third switch being connected to the gate of the first PMOS transistor;
a fourth switch, a first terminal of the fourth switch being connected to the first node, and a second terminal of the fourth switch being connected to the first bit line; and
a fifth switch, a first terminal of the fifth switch being connected to the second bit line, and a second terminal of the fifth switch being connected to the second node;
wherein in the case of reading the data in the memory cell on the first bit line, at the offset compensation stage of the sense amplifier, the first switch, the second switch, the fourth switch and the fifth switch are turned on, and the third switch is turned off;
in the case of reading the data in the memory cell on the second bit line, at the offset compensation stage of the sense amplifier, the first switch, the third switch, the fourth switch and the fifth switch are turned on, and the second switch is turned off.

4. The sense amplifier of claim 3, wherein at the offset compensation stage of the sense amplifier, a source of the first PMOS transistor and a source of the second PMOS transistor receive a first voltage, and a source of the first NMOS transistor and a source of the second NMOS transistor are grounded.

5. The sense amplifier of claim 4, wherein in the case of reading the data in the memory cell on the first bit line, at a first amplification stage of the sense amplifier, the control circuit is arranged to configure the amplification circuit as a third inverter.

6. The sense amplifier of claim 5, wherein in the case of reading the data in the memory cell on the first bit line, at the first amplification stage of the sense amplifier, the second PMOS transistor and the second NMOS transistor are controlled to be in a cutoff region, and the first PMOS transistor and the first NMOS transistor are configured as the third inverter.

7. The sense amplifier of claim 4, wherein in the case of reading the data in the memory cell on the second bit line, at a first amplification stage of the sense amplifier, the control circuit is arranged to configure the amplification circuit as a fourth inverter.

8. The sense amplifier of claim 7, wherein in the case of reading the data in the memory cell on the second bit line, at the first amplification stage of the sense amplifier, the first PMOS transistor and the first NMOS transistor are controlled to be in a cutoff region, and the second PMOS transistor and the second NMOS transistor are configured as the fourth inverter.

9. The sense amplifier of claim 5, wherein the control circuit further comprises:
a sixth switch, a first terminal of the sixth switch being connected to the second node, and a second terminal of the sixth switch being connected to the first bit line; and
a seventh switch, a first terminal of the seventh switch being connected to the second bit line, and a second terminal of the seventh switch being connected to the first node;
wherein at the offset compensation stage of the sense amplifier, the sixth switch and the seventh switch are turned off; and
at the first amplification stage of the sense amplifier, the first switch, the fourth switch and the fifth switch are turned off, and the second switch, the third switch, the sixth switch and the seventh switch are turned on.

10. The sense amplifier of claim 6, wherein in the case of reading the data in the memory cell on the first bit line, at the first amplification stage of the sense amplifier, the source of the first PMOS transistor receives the first voltage, the source of the first NMOS transistor is grounded, and the source of the second PMOS transistor and the source of the second NMOS transistor receive a second voltage; and
wherein the second voltage is less than the first voltage.

11. The sense amplifier of claim 8, wherein in the case of reading the data in the memory cell on the second bit line, at the first amplification stage of the sense amplifier, the source of the second PMOS transistor receives the first voltage, the source of the second NMOS transistor is grounded, and the source of the first PMOS transistor and the source of the first NMOS transistor receive a second voltage; and
wherein the second voltage is less than the first voltage.

12. The sense amplifier of claim 9, wherein at a second amplification stage after the first amplification stage of the sense amplifier, the control circuit is arranged to configure the amplification circuit as a cross-coupled amplification structure.

13. The sense amplifier of claim 12, wherein at the second amplification stage of the sense amplifier, the first switch, the fourth switch and the fifth switch are turned off, and the second switch, the third switch, the sixth switch and the seventh switch are turned on.

14. The sense amplifier of claim 13, wherein at the second amplification stage of the sense amplifier, the source of the first PMOS transistor and the source of the second PMOS transistor receive the first voltage, and the source of the first NMOS transistor and the source of the second NMOS transistor are grounded.

15. The sense amplifier of claim 14, further comprising:
a precharge circuit arranged to precharge the first bit line and the second bit line at a precharge stage before the offset compensation stage of the sense amplifier.

16. The sense amplifier of claim 15, wherein at the precharge stage of the sense amplifier, the first switch, the second switch, the third switch, the sixth switch and the seventh switch are turned off, and the fourth switch and the fifth switch are turned on.

17. The sense amplifier of claim 16, wherein at the precharge stage of the sense amplifier, the source of the first PMOS transistor, the source of the second PMOS transistor, the source of the first NMOS transistor and the source of the second NMOS transistor receive a second voltage.

18. A memory, comprising a sense amplifier, wherein the sense amplifier comprises:
an amplification circuit arranged to read a data in a memory cell on a first bit line or a second bit line; and
a control circuit, electrically connected to the amplification circuit;
wherein in a case of reading the data in the memory cell on the first bit line, at an offset compensation stage of the sense amplifier, the control circuit is arranged to configure the amplification circuit to comprise a first diode structure, a first current mirror structure, and a first inverter with an input terminal and an output terminal connected to each other;
in a case of reading the data in the memory cell on the second bit line, at the offset compensation stage of the sense amplifier, the control circuit is arranged to configure the amplification circuit to comprise a second diode structure, a second current mirror structure, and a second inverter with an input terminal and an output terminal connected to each other.

19. A method for controlling a sense amplifier comprising an amplification circuit and a control circuit, the method for controlling the sense amplifier comprising:
in a case of reading a data in a memory cell on a first bit line, at an offset compensation stage of the sense amplifier, configuring, by the control circuit, the amplification circuit to comprise a first diode structure, a first current mirror structure, and a first inverter with an input terminal and an output terminal connected to each other; and
in a case of reading a data in a memory cell on a second bit line, at the offset compensation stage of the sense amplifier, configuring, by the control circuit, the amplification circuit to comprise a second diode structure, a second current mirror structure, and a second inverter with an input terminal and an output terminal connected to each other.

20. The method for controlling the sense amplifier of claim 19, wherein in the case of reading the data in the memory cell on the first bit line, at a first amplification stage of the sense amplifier, the amplification circuit is configured as a third inverter by the control circuit;
in the case of reading the data in the memory cell on the second bit line, at the first amplification stage of the sense amplifier, the amplification circuit is configured as a fourth inverter by the control circuit; and
in the case of reading the data in the memory cell on the first bit line, at a second amplification stage after the first amplification stage of the sense amplifier, the amplification circuit is configured as a cross-coupled amplification structure by the control circuit.

* * * * *